United States Patent
Palinkas et al.

(10) Patent No.: US 8,584,192 B2
(45) Date of Patent: Nov. 12, 2013

(54) UPSTREAM BANDWIDTH CONDITIONING DEVICE

(75) Inventors: Raymond Palinkas, Canastota, NY (US); Erdogan Alkan, Fayetteville, NY (US)

(73) Assignee: PPC Broadband, Inc., Eeast Syracuse, NY (US)

( * ) Notice: Subject to any disclaimer, the term of this patent is extended or adjusted under 35 U.S.C. 154(b) by 785 days.

(21) Appl. No.: 12/534,936

(22) Filed: Aug. 4, 2009

(65) Prior Publication Data

US 2010/0251321 A1    Sep. 30, 2010

Related U.S. Application Data

(60) Provisional application No. 61/164,843, filed on Mar. 30, 2009, provisional application No. 61/186,641, filed on Jun. 12, 2009.

(51) Int. Cl.
*H04N 7/173* (2011.01)

(52) U.S. Cl.
USPC ........... 725/127; 725/121; 725/124; 725/125; 725/126

(58) Field of Classification Search
USPC ....................................................... 725/127
See application file for complete search history.

(56) References Cited

U.S. PATENT DOCUMENTS

| | | |
|---|---|---|
| 3,790,909 A | 2/1974 | Le Fevre |
| 4,512,033 A | 4/1985 | Schrock |
| 4,520,508 A | 5/1985 | Reichert, Jr. |
| 4,609,878 A | 9/1986 | Rodgers |
| 4,648,123 A | 3/1987 | Schrock |
| 4,677,390 A | 6/1987 | Wagner |
| 4,849,721 A | 7/1989 | Matsuura |
| 4,894,566 A * | 1/1990 | Rush .............................. 327/311 |
| 4,961,218 A | 10/1990 | Kiko |
| 4,982,440 A | 1/1991 | Dufresne et al. |
| 5,010,399 A | 4/1991 | Goodman et al. |
| 5,126,840 A | 6/1992 | Dufresne et al. |
| 5,214,505 A | 5/1993 | Rabowsky et al. |

(Continued)

FOREIGN PATENT DOCUMENTS

| | | | |
|---|---|---|---|
| JP | 55080989 A | 6/1980 | |
| JP | 55132126 A | 10/1980 | |

(Continued)

OTHER PUBLICATIONS

PCT/US2010/024272; International Search Report and Written Opinion. Date of Mailing: Jul. 30, 2010. 9 pp.

(Continued)

*Primary Examiner* — Robert Hance
(74) *Attorney, Agent, or Firm* — Hiscock & Barclay LLP (57) ABSTRACT

An upstream bandwidth conditioning device is provided that can be inserted into a signal transmission line of a CATV system on a premise of a user. The device includes a tunable low pass filter, a tunable high pass filter connected in series with the tunable low pass filter, and at least one voltage control unit. The voltage control unit is configured to adjust each of the tunable low pass filter and the tunable high pass filter between at least a first intermediate frequency range having a first width and a second intermediate frequency range having a second width. The first width differs in size from the second width.

23 Claims, 5 Drawing Sheets

(56) References Cited

U.S. PATENT DOCUMENTS

| | | | |
|---|---|---|---|
| 5,231,660 A | 7/1993 | West, Jr. | |
| 5,369,642 A | 11/1994 | Shioka et al. | |
| 5,548,255 A | 8/1996 | Spielman | |
| 5,745,836 A | 4/1998 | Williams | |
| 5,815,794 A | 9/1998 | Williams | |
| 5,839,052 A | 11/1998 | Dean et al. | |
| 5,881,362 A * | 3/1999 | Eldering et al. | 725/125 |
| 5,893,024 A | 4/1999 | Sanders et al. | |
| 5,937,330 A | 8/1999 | Vince et al. | |
| 5,950,111 A | 9/1999 | Georger et al. | |
| 5,970,053 A | 10/1999 | Schick et al. | |
| 6,011,432 A | 1/2000 | Fratti et al. | |
| 6,014,547 A | 1/2000 | Caporizzo et al. | |
| 6,049,693 A | 4/2000 | Baran et al. | |
| 6,069,960 A | 5/2000 | Mizukami et al. | |
| 6,094,211 A | 7/2000 | Baran et al. | |
| 6,169,569 B1 * | 1/2001 | Widmer et al. | 725/111 |
| 6,205,138 B1 | 3/2001 | Nihal et al. | |
| 6,348,837 B1 | 2/2002 | Ibelings | |
| 6,348,955 B1 | 2/2002 | Tait | |
| 6,373,349 B2 | 4/2002 | Gilbert | |
| 6,377,316 B1 | 4/2002 | Mycynek et al. | |
| 6,388,539 B1 | 5/2002 | Rice | |
| 6,425,132 B1 | 7/2002 | Chappell | |
| 6,495,998 B1 | 12/2002 | Terreault | |
| 6,498,925 B1 | 12/2002 | Tauchi | |
| 6,510,152 B1 | 1/2003 | Gerszberg et al. | |
| 6,560,778 B1 | 5/2003 | Hasegawa | |
| 6,570,928 B1 | 5/2003 | Shibata | |
| 6,587,012 B1 | 7/2003 | Farmer et al. | |
| 6,622,304 B1 | 9/2003 | Carhart | |
| 6,640,338 B1 | 10/2003 | Shibata | |
| 6,678,893 B1 | 1/2004 | Jung | |
| 6,683,513 B2 | 1/2004 | Shamsaifar et al. | |
| 6,686,817 B2 | 2/2004 | Zhu et al. | |
| 6,721,298 B1 | 4/2004 | Vella-Coleiro | |
| 6,725,462 B1 | 4/2004 | Kaplan | |
| 6,728,968 B1 | 4/2004 | Abe et al. | |
| 6,757,910 B1 * | 6/2004 | Bianu | 725/125 |
| 6,804,828 B1 | 10/2004 | Shibata | |
| 6,845,232 B2 | 1/2005 | Darabi | |
| 6,877,166 B1 | 4/2005 | Roeck et al. | |
| 6,882,245 B2 | 4/2005 | Utsunomiya et al. | |
| 6,928,175 B1 | 8/2005 | Bader et al. | |
| 7,003,275 B1 | 2/2006 | Petrovic | |
| 7,024,059 B2 | 4/2006 | Kurchuk | |
| 7,029,293 B2 | 4/2006 | Shapson et al. | |
| 7,039,432 B2 | 5/2006 | Strater et al. | |
| 7,162,731 B2 | 1/2007 | Reidhead et al. | |
| 7,221,924 B2 | 5/2007 | Zheng et al. | |
| 7,283,479 B2 | 10/2007 | Ljungdahl et al. | |
| 7,336,939 B2 | 2/2008 | Gomez | |
| 7,454,252 B2 | 11/2008 | El-Sayed | |
| 7,505,819 B2 | 3/2009 | El-Sayed | |
| 7,530,091 B2 | 5/2009 | Vaughan | |
| 2001/0013132 A1 | 8/2001 | Kudo et al. | |
| 2001/0016950 A1 | 8/2001 | Matsuura | |
| 2002/0141347 A1 | 10/2002 | Harp et al. | |
| 2002/0144292 A1 | 10/2002 | Uemura et al. | |
| 2002/0166124 A1 | 11/2002 | Gurantz et al. | |
| 2003/0112859 A1 | 6/2003 | Content et al. | |
| 2004/0005913 A1 | 1/2004 | Bollenbeck | |
| 2004/0172659 A1 | 9/2004 | Ljungdahl et al. | |
| 2004/0229561 A1 | 11/2004 | Cowley et al. | |
| 2005/0034168 A1 | 2/2005 | Beveridge | |
| 2005/0172327 A1 * | 8/2005 | Kay | 725/127 |
| 2005/0183130 A1 | 8/2005 | Sadja et al. | |
| 2005/0283815 A1 | 12/2005 | Brooks et al. | |
| 2005/0289632 A1 | 12/2005 | Brooks et al. | |
| 2006/0015921 A1 | 1/2006 | Vaughan | |
| 2006/0205442 A1 | 9/2006 | Phillips et al. | |
| 2006/0282871 A1 | 12/2006 | Yo | |
| 2007/0288981 A1 | 12/2007 | Mitsuse et al. | |
| 2007/0288982 A1 | 12/2007 | Donahue | |
| 2008/0022344 A1 | 1/2008 | Riggsby | |
| 2008/0040764 A1 | 2/2008 | Weinstein et al. | |
| 2008/0127287 A1 | 5/2008 | Alkan et al. | |
| 2009/0031391 A1 | 1/2009 | Urbanek | |
| 2009/0047917 A1 | 2/2009 | Phillips et al. | |
| 2009/0077608 A1 | 3/2009 | Romerein et al. | |

FOREIGN PATENT DOCUMENTS

| | | | |
|---|---|---|---|
| JP | 57091055 A | 6/1982 | |
| JP | 58101582 A | 6/1983 | |
| JP | 05899913 | 7/1983 | |
| JP | 59094076 A | 5/1984 | |
| JP | 61157035 A | 7/1986 | |
| JP | 05191416 A | 7/1993 | |
| JP | 07038580 A | 2/1995 | |
| JP | 11069334 A | 3/1999 | |
| JP | 2001177580 A | 6/2001 | |
| JP | 2004080483 A | 3/2004 | |
| JP | 2005005875 A | 1/2005 | |
| JP | 2007166109 A | 6/2007 | |
| JP | 2007166110 A | 6/2007 | |
| KR | 2001035773 | * 10/1999 | |
| KR | 20010019963 A | 3/2001 | |
| WO | WO-0024124 A1 | 4/2000 | |
| WO | WO-0172005 A1 | 9/2001 | |
| WO | WO-0233969 A1 | 4/2002 | |
| WO | WO-02091676 A1 | 11/2002 | |

OTHER PUBLICATIONS

PCT/US2010/024272; International Preliminary Report on Patentability. Date of Mailing: Oct. 13, 2011. 8 pp.

* cited by examiner

UPSTREAM BANDWIDTH CONDITIONING DEVICE

CROSS REFERENCE TO RELATED APPLICATIONS

This application claims priority under 35 U.S.C. §119(e) from U.S. Provisional Patent Application Ser. No. 61/164,843 entitled "UPSTREAM BANDWIDTH CONDITIONING DEVICE" filed on Mar. 30, 2009, and U.S. Provisional Patent Application Ser. No. 61/186,641 entitled "UPSTREAM BANDWIDTH CONDITIONING DEVICE" filed on Jun. 12, 2009 which are incorporated herein by reference.

FIELD OF THE INVENTION

The present invention relates generally to signal conditioning devices for use in cable television ("CATV") systems, and in particular to signal conditioning devices that increase the signal-to-noise ratio of an upstream bandwidth in a CATV system.

BACKGROUND OF THE INVENTION

The use of a CATV system to provide internet, voice over internet protocol (VOIP) telephone, television, security, and music services is well known in the art. In providing these services, a downstream bandwidth (i.e., radio frequency ("RF") signals, digital signals, and/or optical signals) is passed from a supplier of the services to a user, and an upstream bandwidth (i.e., RF signals, digital signals, and/or optical signals) is passed from the user to the supplier. For much of the distance between the supplier and the user, the downstream bandwidth and the upstream bandwidth make up a total bandwidth that is passed via a signal transmission line, such as a coaxial cable. The downstream bandwidth is, for example, signals that are relatively higher frequencies within the total bandwidth of the CATV system while the upstream bandwidth is, for example, signals that are relatively lower frequencies.

Traditionally, the CATV system includes a head end facility, where the downstream bandwidth is initiated into a main CATV distribution system, which typically includes a plurality of trunk lines, each serving at least one local distribution network. In turn, the downstream bandwidth is passed to a relatively small number (e.g., approximately 100 to 500) of users associated with a particular local distribution network. Devices, such as high-pass filters, are positioned at various points within the CATV system to ensure the orderly flow of downstream bandwidth from the head end facility, through the trunk lines, through the local distribution networks, and ultimately to the users.

In stark contrast to the orderly flow of the downstream bandwidth, the upstream bandwidth passing through each of the local distribution networks is a compilation of an upstream bandwidth generated within a premise of each user that is connected to the particular distribution network. The upstream bandwidth generated within each premise includes desirable upstream information signals from a modem, desirable upstream information signals from a set-top-box, and undesirable interference signals, such as noise or other spurious signals. Many generators of such undesirable interference signals are electrical devices that inadvertently generate electrical signals as a result of their operation. These devices include vacuum cleaners, electric motors, household transformers, welders, and many other household electrical devices. Many other generators of such undesirable interference signals include devices that intentionally create RF signals as part of their operation. These devices include wireless home telephones, cellular telephones, wireless internet devices, CB radios, personal communication devices, etc. While the RF signals generated by these latter devices are desirable for their intended purposes, these signal will conflict with the desirable upstream information signals if they are allowed to enter the CATV system.

Undesirable interference signals, whether they are inadvertently generated electrical signals or intentionally created RF signals, may be allowed to enter the CATV system, typically through an unterminated port, an improperly functioning device, a damaged coaxial cable, and/or a damaged splitter. As mentioned above, the downstream/upstream bandwidth is passed through coaxial cables for most of the distance between the user and the head end. This coaxial cable is intentionally shielded from undesirable interference signals by a conductive layer positioned radially outward from a center conductor and positioned coaxial with the center conductor. Similarly, devices connected to the coaxial cable typically provided shielding from undesirable interference signals. However, when there is no coaxial cable or no device connected to a port the center conductor is exposed to any undesirable interference signals and will function like a small antenna to gather those undesirable interference signals. Similarly, a coaxial cable or device having damaged or malfunctioning shielding may also gather undesirable interference signals.

In light of the forgoing, it should be clear that there is an inherent, system-wide flaw that leaves the upstream bandwidth open and easily compromised by any single user. For example, while the downstream bandwidth is constantly monitored and serviced by skilled network engineers, the upstream bandwidth is maintained by the user without the skill or knowledge required to reduce the creation and passage of interference signals into the upstream bandwidth. This issue is further compounded by the number of users connected together within a particular distribution network, especially knowing that one user can easily impact all of the other users.

Attempts at improving an overall signal quality of the upstream bandwidth have not been successful using traditional methods. A measure of the overall signal quality includes such components as signal strength and signal-to-noise ratio (i.e., a ratio of the desirable information signals to undesirable interference signals). Traditionally, increasing the strength of the downstream bandwidth has been accomplished by drop amplifiers employed in or near a particular user's premise. The success of these drop amplifiers is largely due to the fact that there are very low levels of undesirable interference signals present in the downstream bandwidth for the reasons explained more fully above. The inherent presence of the undesirable interference signals in the upstream bandwidth generated by each user has typically precluded the use of these typical, drop amplifiers to amplify the upstream bandwidth, because the undesirable interference signals are amplified by the same amount as the desirable information signals. Accordingly, the signal-to-noise ratio remains nearly constant, or worse, such that the overall signal quality of the upstream bandwidth is not increased when such a typical, drop amplifier is implemented.

For at least the forgoing reasons, a need is apparent for a device that increases the signal strength and increases the signal-to-noise ratio to increase the overall quality of the upstream bandwidth.

SUMMARY OF THE INVENTION

The present invention helps to reduce the effect of undesirable interference signals that are unknowingly injected into the main signal distribution system, through the upstream bandwidth, by the user. By selectively attenuating frequency ranges within the upstream bandwidth, the present invention increases the signal-to-noise ratio of the upstream bandwidth. The present invention further increases the signal strength by amplifying desirable information signals to further increase the overall signal quality.

In accordance with one embodiment of the present invention, an upstream bandwidth conditioning device is provided that can be inserted into a signal transmission line of a CATV system on or proximate to a premise of a user. The device includes a tunable low pass filter and a tunable high pass filter connected in series with the tunable low pass filter. The device further includes at least one voltage control unit configured to adjust each of the tunable low pass filter and the tunable high pass filter between at least a first intermediate frequency range having a first width and a second intermediate frequency range having a second width. The first width differs in size from the second width.

In accordance with one embodiment of the present invention, each of the tunable low pass filter and the tunable high pass filter includes varactor diodes.

In accordance with one embodiment of the present invention, the device further includes a supplier side diplexer connected to a supplier side main signal path and a premise side diplexer connected to a premise side main signal path. The device further includes a return path and a forward path created between the supplier side diplexer and the premise side diplexer. The tunable low pass filter and the tunable high pass filter are connected in series within the return path.

In accordance with one embodiment of the present invention, the device further includes a signal amplification device connected in series with the tunable low pass filter and the tunable high pass filter in the return path. In accordance with one embodiment of the present invention, the signal amplification device is positioned between the premise side diplexer and both of the tunable low pass filter and the tunable high pass filter. In accordance with another embodiment of the present invention, the signal amplification device is positioned between the supplier side diplexer and both of the tunable low pass filter and the tunable high pass filter.

In accordance with one embodiment of the present invention, a voltage output of the voltage control unit adjusts each of the high pass filter and the low pass filter based on a physical input device located on a housing of the device.

In accordance with one embodiment of the present invention, a voltage output of each of voltage control unit adjusts each of the high pass filter and the low pass filter based on a response to control signals generated by a controller. Preferably, the controller receives an information transmission signal from at least one of an upstream bandwidth and a downstream bandwidth. In accordance with one embodiment of the present invention, the information transmission signal is at least one of a tone and a coded information signal.

In accordance with another embodiment of the present invention, the device further includes a signal tap on at least one of a supplier side main signal path and a premise side main signal path. The information transmission signal path passes from the tap to the controller.

In accordance with one embodiment of the present invention, the device further includes a signal amplifier connected in series in the forward path.

In accordance with one embodiment of the present invention, a method is provided for conditioning an upstream bandwidth that is created in a premise of a user using a device located in or proximate to the premise of the user. The method includes providing the device with a tunable low pass filter, and providing the device with a tunable high pass filter connected in series with the tunable low pass filter. The method further includes providing the device with at least one voltage control unit. The method further includes adjusting each of the tunable low pass filter and the tunable high pass filter between a first intermediate frequency range having a first width and a second intermediate frequency range having a second width. The first width differs in size from the second width.

In accordance with one embodiment of the present invention, each of the tunable low pass filter and the tunable high pass filter include varactor diodes.

In accordance with one embodiment of the present invention, each of the tunable low pass filter and the tunable high pass filter are connected in a return path provided in the device.

In accordance with one embodiment of the present invention, the method further includes amplifying at least a portion of the upstream bandwidth present on the return path. In accordance with one embodiment of the present invention, the portion of the upstream bandwidth is amplified after passing though each of the tunable low pass filter and the tunable high pass filter. In accordance with another embodiment of the present invention, the portion of the upstream bandwidth is amplified before passing though each of the tunable low pass filter and the tunable high pass filter.

In accordance with one embodiment of the present invention, the method further includes receiving an information transmission signal from a supplier via a downstream bandwidth, and controlling the at least one voltage control unit in response to the information transmission signal. In accordance with one embodiment of the present invention, the information transmission signal is at least one of a tone and a coded operating signal.

In accordance with one embodiment of the present invention, the method further includes receiving an information transmission signal from a device within the premise, and controlling the at least one voltage control unit in response to the information transmission signal. In accordance with one embodiment of the present invention, the information transmission signal is at least one of a tone and a coded operating signal.

BRIEF DESCRIPTION OF THE DRAWINGS

For a further understanding of the objects of the invention, reference will be made to the following detailed description of the invention, which is to be read in connection with the accompanying drawings, where.

The drawings are not necessarily to scale, emphasis instead generally being placed upon illustrating the principles of the invention. In the drawings, like numerals are used to indicate like parts throughout the various views.

DETAILED DESCRIPTION OF THE INVENTION

Figure 1:
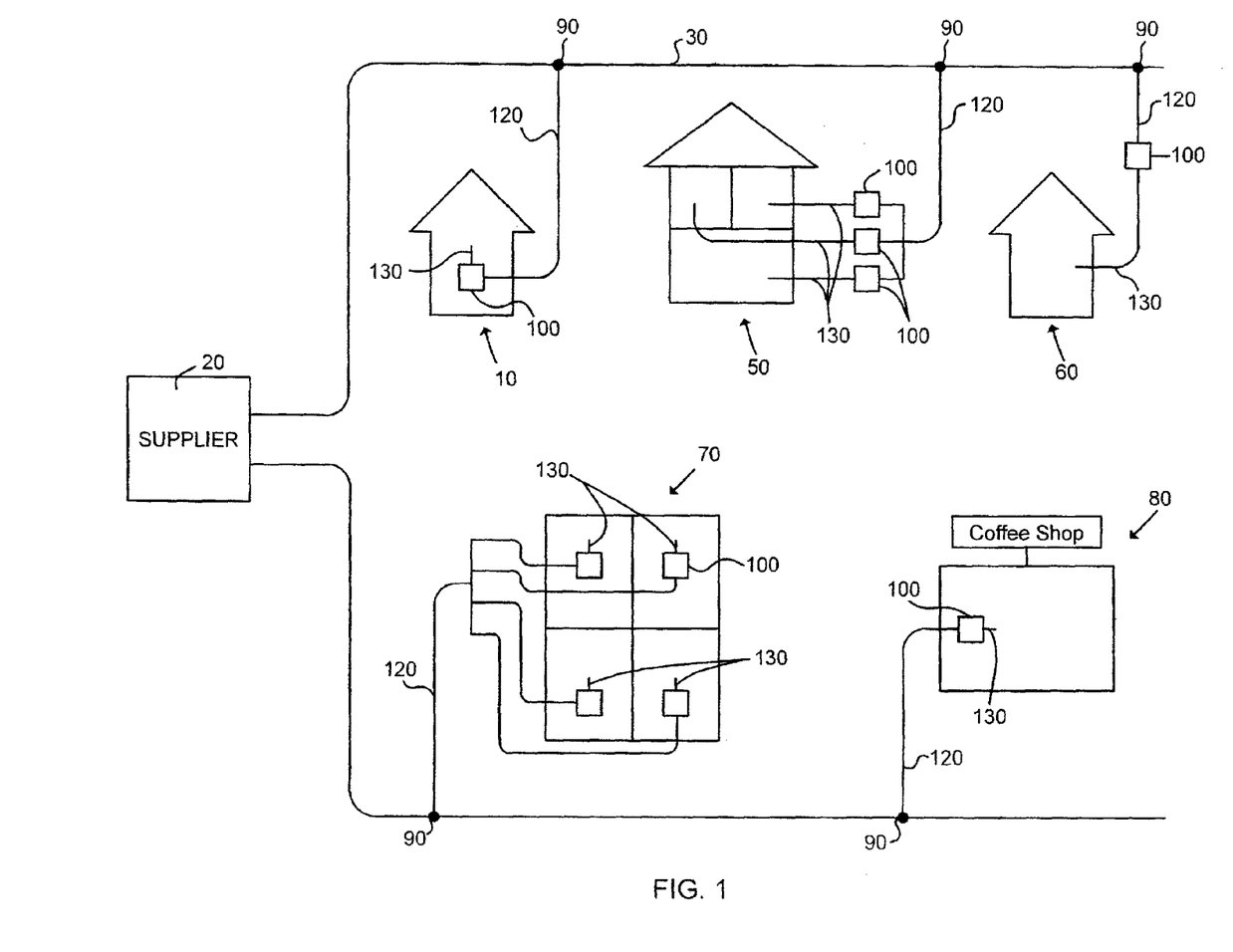
FIG. 1 is a graphical representation of a CATV system arranged in accordance with an embodiment of the present invention.

As shown in FIG. 1, a CATV system typically includes a supplier 20 that transmits a downstream bandwidth, such as RF signals, digital signals, and/or optical signals, to a user through a main distribution system 30 and receives an upstream bandwidth, such as RF signals, digital signals, and/or optical signals, from the user through the same main signal distribution system 30. A tap 90 is located at the main signal distribution system 30 to allow for the passage of the downstream/upstream bandwidth from/to the main signal distribution system 30. A drop transmission line 120 is then used to connect the tap 90 to a house 10, 60 an apartment building 50, 70, a coffee shop 80, and so on. As shown in FIG. 1, an upstream bandwidth conditioning device 100 of the present invention may be connected in series between the drop transmission line 120 and a user's premise distribution system 130.

Referring still to FIG. 1, it should be understood that the upstream bandwidth conditioning device 100 can be placed at any location between the tap 90 and the user's premise distribution system 130. This location can be conveniently located within a premise (e.g., the house 10, the apartment building 50, etc.), or proximate to the premise (e.g., the house 60, the apartment building 70, etc.). It should be understood that the upstream bandwidth conditioning device 100 can be placed at any location, such as the coffee shop 80 or other business, where CATV services, including internet services, VOIP services, or other unidirectional/bidirectional services are being used.

Figure 2:
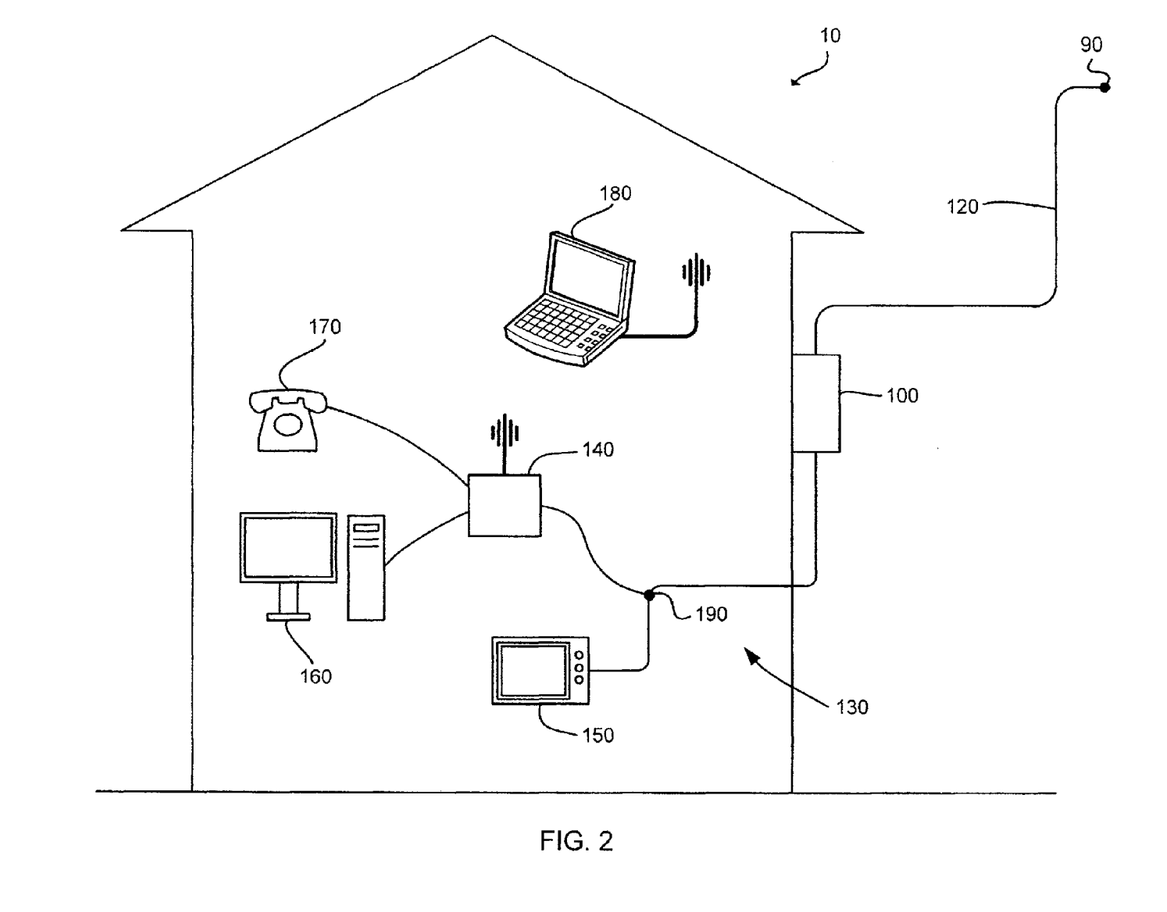
FIG. 2 is a graphical representation of a premise of a user arranged in accordance with an embodiment of the present invention.

As shown in FIG. 2, the user's premise distribution system 130 may be split using a splitter 190 so that downstream/upstream bandwidth can pass to/from a television 150 and a modem 140 in accordance with practices well known in the art. The modem 140 may include VOIP capabilities affording services for a telephone 170 and may include a router affording internet services to a desktop computer 160 and a laptop computer 180, for example.

Additionally, it is common practice to provide a set-top box ("STB") or a set-top unit ("STU") for use directly with the television 150. For the sake of clarity, however, there is no representation of a STB or a STU included in FIG. 2. The STB and STU are mentioned here in light of the fact that many models utilize the upstream bandwidth to transmit information relating to "pay-per-view" purchases, billing, utilization, and other user interactions, all of which may require information to be sent from the STB or STU to the supplier 20. Accordingly, it should be understood that even though FIG. 2 explicitly shows that there is only one upstream bandwidth conditioning device 100 used for one device (i.e., the modem 140), each upstream bandwidth conditioning device 100 may be used with two or more devices (e.g., a modem, a STB, a STU, and/or a dedicated VOIP server.) that transmit desirable upstream information signals via the upstream bandwidth.

Further, while not shown explicitly in FIG. 2, there may be two (or more) upstream bandwidth conditioning devices 100 located within or proximate to a single premise. For example, there may be an upstream bandwidth conditioning device 100 located between the modem 140 and the splitter 190 and another upstream bandwidth conditioning device 100 located between an STB or STU on the television 150 and the splitter 190. Similarly, there may be an upstream bandwidth conditioning device 100 located at any point in the premise distribution system 130 where an upstream bandwidth is being passed (e.g., from a modem, a STB, a STU, a VOIP server, etc).

Further, while not shown explicitly in FIG. 2, there may by one upstream bandwidth conditioning device 100 located proximate to two user premises when there is one drop transmission line 120 used to connect the tap 90 to both of the two user premises. Even though such an arrangement is not considered ideal, because the upstream bandwidth from two users may be merged prior to being conditioned, such an arrangement may be necessary when the two premises are located too closely to one another for the physical placement of separate upstream bandwidth conditioning devices 100.

It should be understood that the goal of placing the upstream signal conditioning device 100 in one of the locations described above is to increase the overall quality of the upstream bandwidth in the main distribution system 30 by increasing the signal-to-noise ratio of the upstream bandwidth leaving a user's premise before that particular user's upstream bandwidth is merged with those of other users. As discussed above, merely amplifying the upstream bandwidth fails to achieve the desired result because the undesirable interference signals present in the upstream bandwidth are also amplified.

A significant amount of undesirable interference signals may occur within lower frequencies of the upstream bandwidth and within higher frequencies of the upstream bandwidth, while the desirable information signals are often present in intermediate frequencies of the upstream bandwidth. For example, in an upstream bandwidth spanning a 5-42 MHz, there may be no desirable information signals in the 5-10 MHz range and in the 38-42 MHz range, while there are likely desirable information signals in the 11-37 MHz range. Based on this example, the signal-to-noise ratio of this upstream bandwidth could be significantly increased by attenuating or blocking signals in the 5-10 MHz range and the 38-42 MHz range while amplifying signals in the 11-37 MHz range. While a system with fixed range of attenuation and a fixed range of amplification may be helpful to increase the signal-to-noise ratio in the upstream bandwidth in the present example, it is expected that (i) additional undesirable interference signals may remain present in the amplified range, (ii) desirable information signals may not always be present in the amplified range, (iii) desired signals may become present in the attenuated range, and (iv) and the entire range of the upstream bandwidth may change. Accordingly, the present upstream bandwidth conditioning device 100, has been developed to change the range of frequencies attenuated at a lower frequency portion and a higher frequency portion such that the intermediate frequency portion can be broadened and/or narrowed as necessary to allow the passage of the desirable signals.

Figure 3:
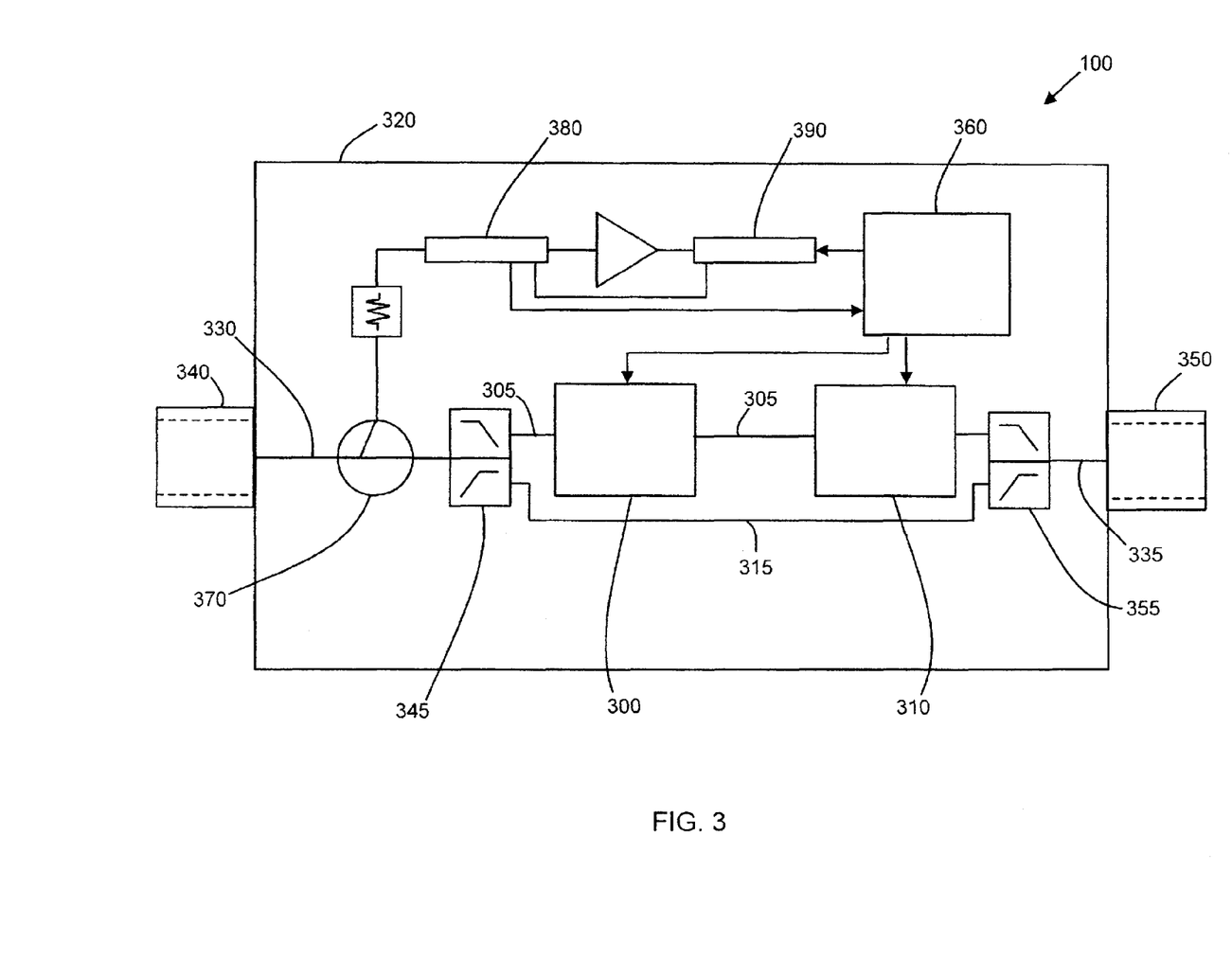
FIG. 3 is a circuit diagram of an upstream bandwidth conditioning device made in accordance with an embodiment of the present invention.

Referring now to FIG. 3, one embodiment of the upstream bandwidth conditioning device 100 includes a supplier side diplexer 345 connected to a supplier side connector 340 via a supplier side main path 330. A premise side diplexer 355 is connected to a premise side connector 350 via a premise side main path 335. In this arrangement, the diplexers 345, 355 create a return path 305 for the upstream bandwidth and a forward path 315 for the downstream bandwidth. All of these components may be provided in a single housing 320 for simplicity and ease of installation.

A tunable filter 300 and a signal amplification device 310 are provided within the return path 305. The upstream bandwidth conditioning device 100 may be arranged, as shown, such that the upstream bandwidth passes through the tunable filter 300 after passing through the signal amplification device 310. This arrangement may be beneficial because the tunable filter 300 would attenuate any undesirable interference signals created by the signal amplification device 310. Alternatively, the upstream bandwidth could be passed through the tunable filter 300 prior to entering the signal amplification device 310. Such an arrangement may be beneficial because undesirable interference signals filtered by the tunable filter 300 are removed prior to amplification.

The signal amplification device 310 may be any of the well known devices for amplifying a signal, whether it is an electromagnetic signal or an optical signal. For example, a conventional bipolar transistor amplifier or a field-effect transistor amplifier could be used to amplify electromagnetic signals. The design of the tunable filter 300 will be discussed more fully below.

Each of the supplier side connector 340 and the premise side connector 350 can be a traditional threaded 75 ohm connector so that the upstream bandwidth conditioning device 100 can be easily placed in series with any portion of the premise distribution system 130 and/or in series between the drop transmission line 120 and the premise distribution system 130 using readily available "F" type connectors. Alternatively, each of the supplier side connector 340 and the premise side connector 350 may be a proprietary connector to hinder attempts at tampering with or theft of the upstream bandwidth conditioning device 100. Other connectors may also be used depending on the type and/or size of the drop transmission line 120, the type and/or size of the premise distribution system 130, or the impedance of the overall system.

Figure 4:
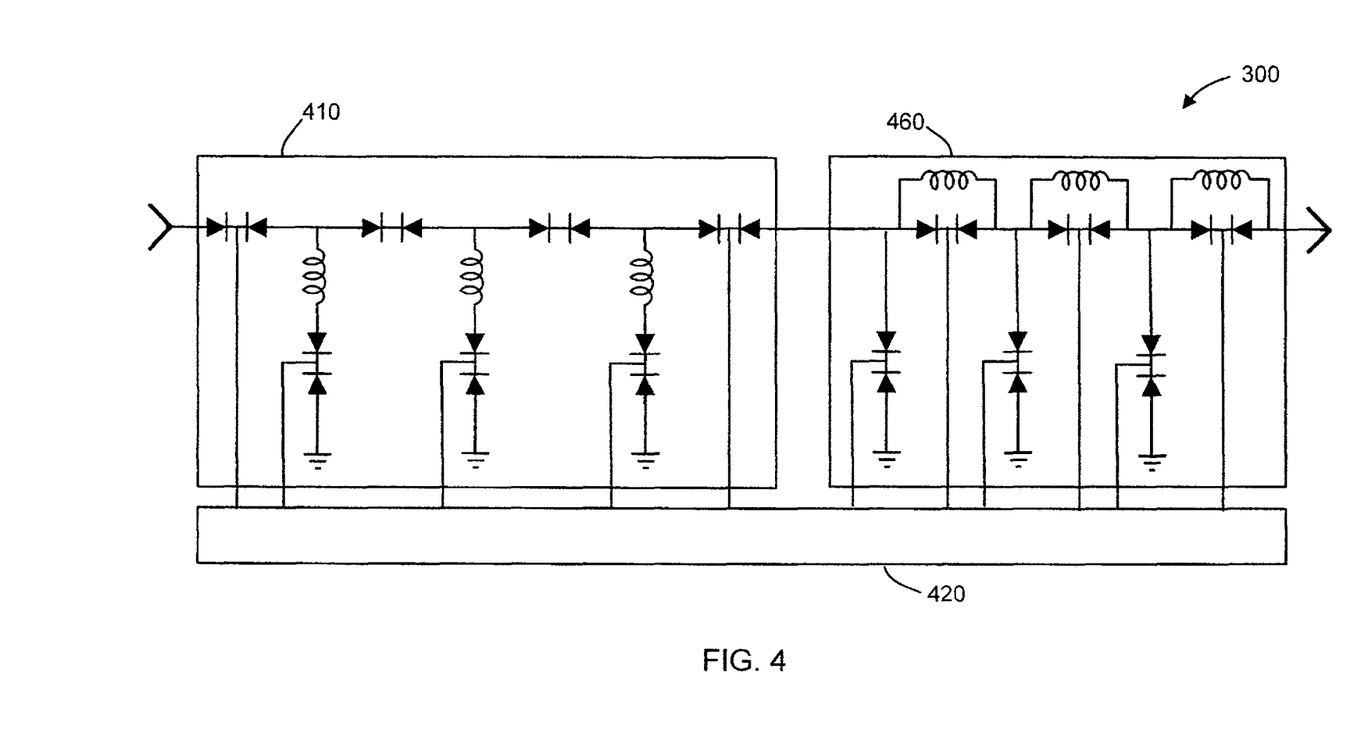
FIG. 4 is a graphical representation of a tunable band-pass filter using varactor diodes made in accordance with one embodiment of the present invention.

Referring now to FIG. 4, one embodiment of the tunable filter 300 includes a high-pass filter 410 and a low-pass filter 460 arranged in series. The high-pass filter 410 includes varactor diodes, as shown. Similarly, the low-pass filter 460 includes varactor diodes, as shown. Each of the high-pass filter 410 and the low-pass filter 460 are controlled by a voltage control unit 420.

The voltage control unit 420 provides the voltages necessary to individually adjust the frequencies passed by each of the high-pass filter 410 and the low-pass filter 460. The voltage control unit 420 may be manually adjustable so that an individual user or technician may be able to individually adjust the width and position of the frequencies passed by the combination of the high-pass filter 410 and the low pass filter 460. Alternatively, the voltage control unit 420 may digitally control each of the high-pass filter 410 and the low-pass filter 460 separately based on an external input. Possible external inputs will be described in further detail below. While the voltage control unit 420 is represented as a single device, it is envisaged that the voltage control unit may, for example, be two units or more separate units.

While it is envisaged that each of the low-pass filter 460 and the high-pass filter 410 will be varactor diodes because of their ability for be adjusted with changes in voltage, it should be understood that other similarly adjustable high-pass filters and low-pass filers could be exchanged with the present filters. Further, these filters could be adjustable using voltages, as with the present design, or may be adjustable using current, pulse width modulation or other techniques specific to the design of the adjustable filter design.

Figure 5:
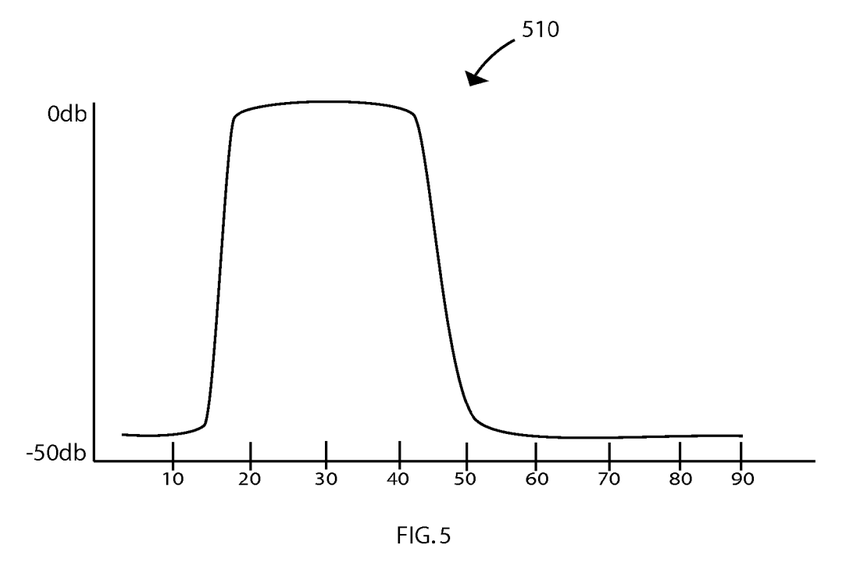
FIG. 5 is frequency response graph created using an embodiment of the present invention.
Figure 6:
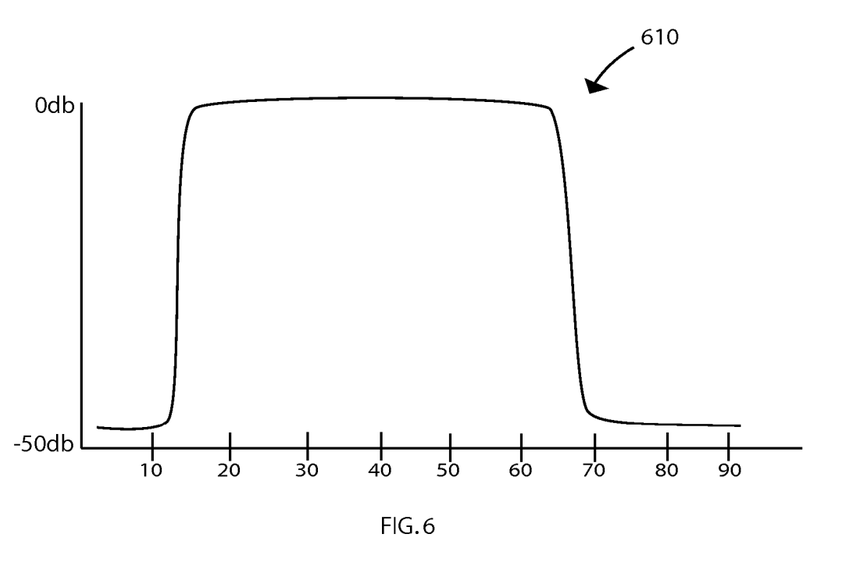
FIG. 6 is frequency response graph created using the same embodiment of the present invention used to create the frequency response graph of FIG. 5.

As shown in FIGS. 5 and 6, the individual adjustment of the high-pass filter 410 and the low-pass filter 460 allows for the passage of an intermediate frequency which has a width that can be widened, narrowed, and positioned. Referring specifically to FIG. 5, the high-pass filter 410 has been adjusted to pass the frequencies above about 18 MHz, and the low-pass filter 460 has been adjusted to pass frequencies below about 45 MHz. In this example, an intermediate frequency portion 510 is created having a range of about 18-45 MHz and a width of about 27 MHz. It should be understood that the term "about" is used herein because cut-off frequencies for both the high-pass filter and the low-pass filter are not exact and occur over a small frequency range. These small frequency ranges will be accounted for to avoid an inadvertent attenuation of desired frequencies.

As represented in FIG. 6, the high-pass filter 410 has been adjusted to pass the frequencies above about 15 MHz, and the low-pass filter 460 has been adjusted to pass frequencies below about 70 MHz. In this example, an intermediate frequency portion 610 is created having a range of about 15-70 MHz and a width of about 55 MHz. In each instance, the voltage control unit 420 controlled each of the high pass filter 410 and the low pass filter 460 based on instructions provided to it by a controller 360 (FIG. 3). A wide variety of other ranges and widths are possible.

The controller 360 may determine how to adjust the high-pass filter 410 and the low pass filter 460 based on an information transmission signal sent by the supplier 20. A signal coupler 370 allows for a receiver 380 to receive the information transmission signal, such as, for example, a tone, a coded operational signal, or other known information transmission that can be understood by the controller 360 to describe the width and location of the intermediate frequency portion to pass. The frequency of the receiver 380 can be set by the controller 360 and can be tuned by a phase-locked loop control system 390 in a manner that is well known in the art.

While the present embodiment discloses that the information transmission signal is sent by the supplier, it is also envisaged that the information control signal may be generated and sent by a device within the premise of the user. For example, it is envisaged that the television 150 (more likely a STB or STU positioned on or near the television), the modem 140, or any other device that utilizes the upstream bandwidth will transmit an information transmission signal to the upstream signal conditioning device 100. Accordingly, each of these devices could send an information control signal that describes the frequencies that need to be allowed to pass to the supplier 20. In such an arrangement, the upstream signal conditioning device 100 may have the tap 370 positioned in the premise side main signal path 335 instead of its current location in the supplier side main signal path 330. This position of the tap 370 would allow information transmission signals sent in the upstream bandwidth from the devices in the premise to reach the tap 370 regardless of the width and positioning of an intermediate frequency portion. In other words, it is envisaged that any such information transmission signal sent by a device in the premise using the upstream bandwidth could be blocked by the tunable filter 300 from reaching the tap 370 in its location shown in FIG. 3.

It should be understood that the tap 370 positioned in the premise side main signal path 335 may be able to receive information transmission signals from both the supplier 20 and the devices within the premise (e.g., the television 150, the modem 140, etc.). While there may be a signal conditioning device present in the forward path 315 of the upstream signal conditioning device 100, any information transmission signal transmitted by the supplier 20 would likely pass through to the premise side main signal path 335 and any tap 370 located therein. Accordingly, it may not be necessary to include a tap 370 in each of the supplier side main signal path 330 and the premise side main signal path 335 to receive information transmission signals from both the supplier 20 and the devices within the premise.

The frequency of the receiver 380 can be set by the controller 360 and can be tuned to a particular frequency by a phase-locked loop control system 390 in any of the manners that are well known in the art. The receiver 380 may also be fixed to a single frequency if and/or when that frequency is sufficient to carry the desired information transmission signal. It should be understood that the particular frequency is only important to the degree that the receiver 380 must be tuned to a particular frequency where the information transmission signal is expected in order to receive the information transmission signal. In the present instance, the particular frequency is a frequency within a range of 110-135 MHz because the components of the receiver 380, a low power mixer FM IF system SA605DK and clock generator ADF4001, are relatively inexpensive for this frequency range. It should also be understood that the particular frequencies may, as in the present case, be a frequency within a typical CATV channel, but between the video carrier frequency and audio carrier frequency.

Further, as described below, there may be multiple particular frequencies with some located in the upstream bandwidth and some located in the downstream bandwidth. For example, when the information transmission signal is being passed from the supplier 20, the information transmission signal may be sent on one or more particular frequencies within the downstream bandwidth. Alternatively, when the information transmission signal is sent from a device within the premise of the user, the information transmission signal may be sent using one or more particular frequencies within the upstream bandwidth. In such cases, there may be one receiver 380 that is tunable between the particular frequencies or one receiver 380 for each particular frequency (e.g., one receiver for use with the upstream bandwidth, and one receiver for use with the downstream bandwidth).

In its simplest form, the information transmission signal can be a tone, such as a 100 kHz tone that is RF modulated onto the particular frequency. Is a tone is going to be used as an information transmission signal, the receiver 380 may then include a tone demodulator, which are well known in the art, to identify whether a tone is present and provide an output to the controller 360 indicating whether a tone is present. As indicated above, there may be provisions in the upstream bandwidth conditioning device 100 for more than one receiver 380 or a receiver 380 that can tune to a plurality of frequencies to identify tones in those frequencies for the purpose of providing a more detailed control of the upstream bandwidth conditioning device 100. The more detailed control may allow for more precise control of the frequencies that are to be attenuated and that are to be passed and amplified. This more detailed control may also be accomplished by incorporating an information transmission signal that includes a coded operational signal.

A coded operational signal may be provided on the particular frequency along with the tone, or the coded operational signal may be provided by itself on the particular frequency. In the present embodiment, a coded operational signal is RF modulated along with the tone. For example, the coded operational signal is provided at 500 MHz on the particular frequency, and provides for a transfer rate of 2400 baud. To accommodate the tone and the coded operational signal in the present example, the mixer in the receiver 380 provides two outputs, one with a band pass filter to pass the 100 Hz tone to the tone demodulator, and one with a band pass filter to pass the 500 MHz signals to a demodulator, which is well known in the art, to convert the RF signals into a data steam, such as RS232, suitable for use by the controller 360.

It is also envisaged that the receiver 380 of the upstream bandwidth conditioning device 100 may include full cable modem functionality. For example, the controller 360 may include a cable modem configured to operate in accordance with the DOCSIS standard such that the supplier 20 would be able to access each individual upstream bandwidth by an identifiable address, such as a modem number and/or a TCP/IP address. Using this format, the supplier can provide the controller 380 with a detailed set of parameters, including the frequencies to be attenuated, the frequencies to be pass, and how much amplification to apply to the frequencies that are passed, using information transfer and control methods that will be understood by one skilled in the art based on the present specification.

It should be understood that any of the known information transmission signals, including those described above, may be incorporated into the present upstream bandwidth conditioning device 100. It is also important to note that the present upstream bandwidth conditioning device 100 may be configured to accept a combination of the known information transmission, such as tones, digital signals to be demodulated into serial data, digital signals according to the DOCSIS standard, and any other information signals that perform a similar function to these.

In light of the forgoing, it should also be understood that the controller 360 can be any one of a variety of devices, depending on the sophistication of the information transmission signals to be used. In the most simplistic case, the controller 360 can be a manual input device allowing a service technician to manually enter the frequencies that are to be attenuated, passed, amplified, or otherwise conditioned. As it is shown in FIG. 3 with the receiver 380 and the phase-locked loop control system 390, the controller 360 may preferably be an analog logic circuit or a microprocessor. In an example using tones for the information transmission signals, an analog circuit may be suitable to adjust the voltage control unit 420 and potentially the signal amplification device 310 based on whether the tone is present. However, it may be more simple to utilize a microprocessor, which can be easily programmed incorporate the information provided in the information transmission signal and adjust the voltage control unit and potentially the signal amplification device 310 based on the provided information.

While the present invention has been particularly shown and described with reference to the preferred mode as illustrated in the drawings, it will be understood by one skilled in the art that various changes in detail may be effected therein without departing from the spirit and scope of the invention as defined by the claims.

The invention claimed is:

1. An upstream bandwidth conditioning device that can be inserted into a signal transmission line of a CATV system in or proximate to a premise of a user, said device comprising:
   a return path and a forward path created between a supplier side diplexer and a premise side diplexer, the return path including an upstream bandwidth transmission path;
   a signal amplification device configured to amplify a desirable signal through the upstream bandwidth transmission path, the signal amplification device located within the return path and external to the forward path;
   a tunable low pass filter within the return path and external to the forward path;
   a tunable high pass filter within the return path and external to the forward path, and connected in series with the tunable low pass filter, wherein the tunable low pass filter in combination with the tunable high pass filter is connected between the supplier side diplexer and the signal amplification device so as to prevent amplification of undesirable interference signals on the return path; and at least one voltage control unit configured to adjust each of the tunable low pass filter and the tunable high pass filter between at least a first intermediate frequency range, of an upstream bandwidth, having a first width including a first position and a second intermediate frequency range, of the upstream bandwidth, having a second width including a second position, the first width differing in size from the second width, the first position differing from the second position, wherein the at least one voltage control unit is connected to the tunable low pass filter and the tunable high pass filter.

2. The device of claim 1, wherein each of the tunable low pass filter and the tunable high pass filter includes varactor diodes.

3. The device of claim 1, wherein the premise side diplexer is connected to a premise side main signal path, wherein the supplier side diplexer is connected to a supplier side main signal path, and wherein the tunable low pass filter and the tunable high pass filter are connected in series within the return path.

4. The device of claim 3, wherein the signal amplification device is connected in series with the tunable low pass filter and the tunable high pass filter in the return path.

5. The device of claim 4, wherein the signal amplification device is positioned between the premise side diplexer and both of the tunable low pass filter and the tunable high pass filter.

6. The device of claim 4, wherein the signal amplification device is positioned between the supplier side diplexer and both of the tunable low pass filter and the tunable high pass filter.

7. The device of claim 1, wherein a voltage output of the voltage control unit adjusts each of the high pass filter and the low pass filter based on a physical input device located on a housing of the device.

8. The device of claim 1, wherein a voltage output of each of voltage control unit adjusts each of the high pass filter and the low pass filter based on a response to control signals generated by a controller.

9. The device of claim 8, wherein the controller receives an information transmission signal from at least one of an upstream bandwidth and a downstream bandwidth.

10. The device of claim 9, wherein the information transmission signal is at least one of a tone and a coded information signal.

11. The device of claim 9 further comprising a signal tap on at least one of a supplier side main signal path and a premise side main signal path, wherein the information transmission signal path passes from the tap to the controller.

12. The device of claim 3 further comprising a signal amplifier connected in series in the forward path.

13. The device of claim 1, wherein said forward path is directly connected between said supplier side duplexer and said premise side duplexer.

14. The device of claim 1, wherein the undesirable interference signal comprises noise.

15. A method of conditioning an upstream bandwidth that is created in a premise of a user using a device located in or proximate to the premise of the user, the method comprising:

providing the device with a return path and a forward path between a supplier side diplexer and a premise side diplexer, the return path including an upstream bandwidth transmission path;

providing the device with a signal amplification device within the return path and external to the forward path;

amplifying, by the signal amplification device, a desirable signal through the upstream bandwidth transmission path;

providing the device with a tunable low pass filter within the return path and external to the forward path;

providing the device with a tunable high pass filter within the return path, external to the forward path, and connected in series with the tunable low pass filter, wherein the tunable low pass filter in combination with the tunable high pass filter is connected between the supplier side diplexer and the signal amplification device so as to prevent amplification of undesirable interference signals on the return path;

providing the device with at least one voltage control unit;

adjusting, by the at least one voltage control unit in response to instructions from a controller device, each of the tunable low pass filter and the tunable high pass filter between a first intermediate frequency range having a first width including a first position and a second intermediate frequency range having a second width including a second position, the first width differing in size from the second width, the first position differing from the second position, wherein the at least one voltage control unit is connected to the tunable low pass filter and the tunable high pass filter.

16. The method of claim 15, wherein each of the tunable low pass filter and the tunable high pass filter include varactor diodes.

17. The method of claim 15, wherein each of the tunable low pass filter and the tunable high pass filter are connected in the return path provided in the device.

18. The method of claim 15 wherein the portion of the upstream bandwidth is amplified after passing though each of the tunable low pass filter and the tunable high pass filter.

19. The method of claim 15 wherein the portion of the upstream bandwidth is amplified before passing though each of the tunable low pass filter and the tunable high pass filter.

20. The method of claim 15 further comprising receiving an information transmission signal from a supplier via a downstream bandwidth; and controlling the at least one voltage control unit in response to the information transmission signal.

21. The method of claim 20, wherein the information transmission signal is at least one of a tone and a coded operating signal.

22. The method of claim 15 further comprising receiving an information transmission signal from a device within the premise; and controlling the at least one voltage control unit in response to the information transmission signal.

23. The method of claim 22, wherein the information transmission signal is at least one of a tone and a coded operating signal.

* * * * *

UNITED STATES PATENT AND TRADEMARK OFFICE
CERTIFICATE OF CORRECTION

PATENT NO. : 8,584,192 B2  
APPLICATION NO. : 12/534936  
DATED : November 12, 2013  
INVENTOR(S) : Raymond Palinkas et al.

It is certified that error appears in the above-identified patent and that said Letters Patent is hereby corrected as shown below:

Please amend title page of patent, item (73), as follows:

Item (73), please change "Eeast" to --East--.

Signed and Sealed this
Second Day of September, 2014

Michelle K. Lee
*Deputy Director of the United States Patent and Trademark Office*